United States Patent [19]

Sakamoto et al.

[11] Patent Number: 5,069,641
[45] Date of Patent: Dec. 3, 1991

[54] MODULAR JACK

[75] Inventors: Yukio Sakamoto; Toshio Hori, both of Fukui; Iwao Fukutani, Takefu, all of Japan

[73] Assignee: Murata Manufacturing Co., Ltd., Kyoto, Japan

[21] Appl. No.: 647,932

[22] Filed: Jan. 30, 1991

[30] Foreign Application Priority Data

Feb. 3, 1990 [JP] Japan .................. 2-10076[U]

[51] Int. Cl.⁵ ............................. H01R 13/66
[52] U.S. Cl. .................... 439/620; 333/182; 439/676
[58] Field of Search .......... 439/76, 83, 620, 676; 336/192; 333/182–184

[56] References Cited

U.S. PATENT DOCUMENTS

| | | | |
|---|---|---|---|
| 4,329,665 | 5/1982 | Kuwai et al. | |
| 4,602,122 | 7/1986 | Lint. | |
| 4,726,638 | 2/1988 | Farrar et al. | 439/620 |
| 4,772,224 | 9/1988 | Talend. | |
| 4,799,901 | 1/1989 | Pirc | 439/620 |
| 4,845,393 | 7/1989 | Burgess et al. | |
| 4,878,848 | 11/1989 | Ingalsbe | 439/676 X |
| 5,015,204 | 5/1991 | Sakamoto et al. | 439/620 |

FOREIGN PATENT DOCUMENTS

AS-2042342 11/1971 Fed. Rep. of Germany.
0266784 11/1988 Japan .................. 439/76

*Primary Examiner*—Eugene F. Desmond
*Attorney, Agent, or Firm*—Burns, Doane, Swecker & Mathis

[57] ABSTRACT

Disclosed is a modular jack to be mounted on a circuit board, and the modular jack has a printed board containing a noise suppressing electronic element in a housing. The printed board is fitted with contactors for contacting with plugs and terminals to be used for mounting the modular jack on the circuit boad. The contactors and the terminals are electrically connected with the noise suppressing electronic element by wires on the printed board.

6 Claims, 5 Drawing Sheets

MODULAR JACK

BACKGROUND OF THE INVENTION

1. Field of the Invention

The present invention relates to a modular jack in a modular connector adopted to be provided for an electronic appliance such as a telephone, a facsimile or the like.

2. Description of Prior Art

As measures to suppress noise of an electronic appliance in which an modular jack is employed, the followings have been known: (1) providing a pair of three-terminal capacitors 6 on a circuit board 4 such as a printed board on which a modular jack 2 is mounted (see FIG. 11), and (2) providing a common mode choke coil 8 on the circuit board 4 on which the modular jack 2 is mounted (see FIG. 12).

Each of the three-terminal capacitors 6 has an equivalent circuit as shown in FIG. 13, and noise is brought outside through an earth. The common mode choke coil 8 has an equivalent circuit as shown in FIG. 14, and two coils coiled on a core in the opposite direction eliminates common mode noise. However, using an additional part like the pair of three-terminal capacitors 6 or the common mode choke coil 8 consumes space on the circuit board 4 (such an additional part sometimes requires more space than the modular jack 2), which interferes with making the electronic appliance compact. Further, in both ways, since the pair of capacitors 6 or the common mode choke coil 8 is away from the modular jack 2, the appliance receives external noise.

In the light of these problems, we disclosed in U.S. Pat. No. 5,015,204 and German patent DE-AS-202342 a modular jack containing a common mode choke coil which comprises a ring-shaped core and two coils coiled thereon. One end of the coils is made to be a contactor with a plug, and the other end is made to be a terminal to be used for mounting the modular jack on a circuit board. The modular jack according to the invention has advantages that it functions as a noise suppressor because it contains a common mode choke coil and that it is compact because a coil, a contactor and a terminal are made into a unit. However, the modular jack has the following drawbacks. In plating the contactor and the terminal, the coil will be plated unnecessarily because the coil, the contactor and the terminal are made into a unit, and this increases production cost. In order to increase the number of signal circuits, more common mode choke coils are necessary, which requires more space for cores, and the modular jack cannot be made compact. Because of the cores, the pitch among the terminals is more than the pitch 1.02 mm of an ordinary circuit board on which the modular jack is mounted, and a newly designed circuit board will be required.

SUMMARY OF THE INVENTION

It is an object of the present invention to provide a compact and economic modular jack which also functions as a noise suppressor.

Another object of the present invention is to provide a modular jack wherein the pitch among terminals can be set to the ordinary pitch 1.02 mm and any other values.

In order to attain the objects above, a modular jack according to the present invention has a printed board containing a noise suppressing electronic element in an insulating housing. A contactor for contacting with a plug and a terminal for contacting with a circuit board are electrically connected with the electronic element by wires on the printed board. As the noise suppressing electronic element, an array of common mode choke coils, a chip inductor, a chip capacitor, etc. are used.

With the structure, it is possible to obtain a compact modular jack containing a noise suppressing electronic element, which modular jack hardly receives external noise. In the structure, the noise suppressing electronic element, the contactor and the terminal can be combined properly for effective noise suppression case by case. The contactor and the terminal can be plated with different metals, thereby reducing cost. A change in wire patterns on the printed board meets an increase of the required number of signal circuits, thereby never requiring more space. Further, since the terminals are protruded from the printed board, the pitch among the terminals can be set to the ordinary pitch 1.02 mm and any other values.

BRIEF DESCRIPTION OF THE DRAWINGS

These and other objects and features of the present invention will become apparent from the following description taken in conjunction with the preferred embodiments thereof in reference to the accompanying drawings, in which.

DETAILED DESCRIPTION OF THE PREFERRED EMBODIMENTS

Figure 1:
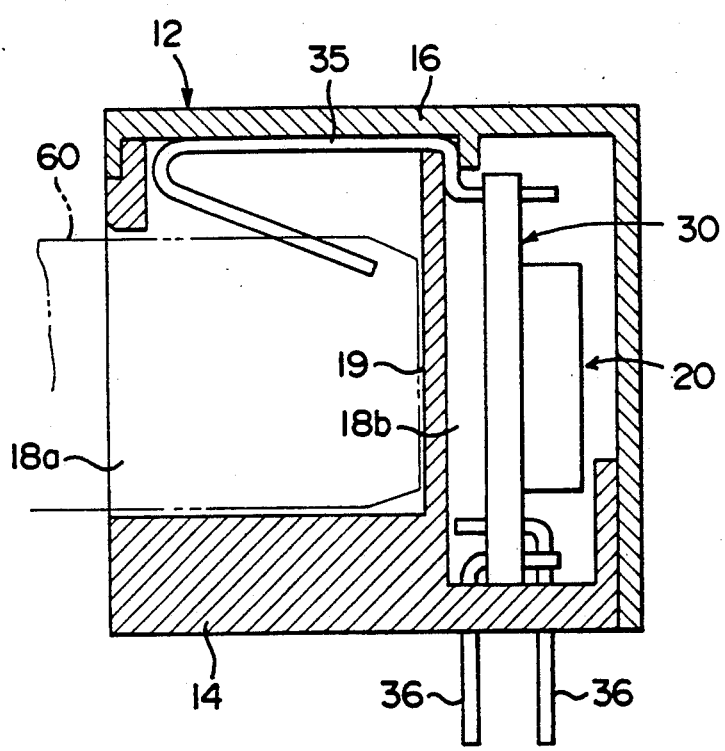
FIG. 1 is a cross sectional view of a modular jack which is a first embodiment of the present invention.

The following describes preferred embodiments of the present invention referring to the drawings.

First Embodiment: FIGS. 1-5

Referring to FIG. 1, a modular jack has an insulating housing 12 which comprises a base 14 and a lid 16 which are engaged by interlocked coupling. Both the base 14 and the lid 16 are made of an insulating material such as plastic. The base 14 has a separator 19 which divides the interior of the housing 12 into two chambers 18a (left side in the drawing) and 18b (right side in the drawing). The chamber 18a is to receive modular plugs 60, and it has an opening through which the modular plugs 60 are inserted. The chamber 18b is to house a printed board 30 containing a common mode choke coil array 20.

Figure 2:
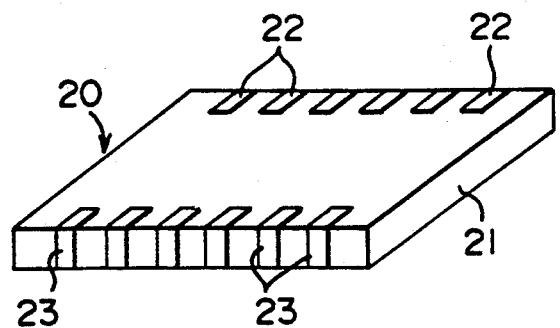
FIG. 2 is a perspective view of a common mode choke coil array of the first embodiment.
Figure 3:
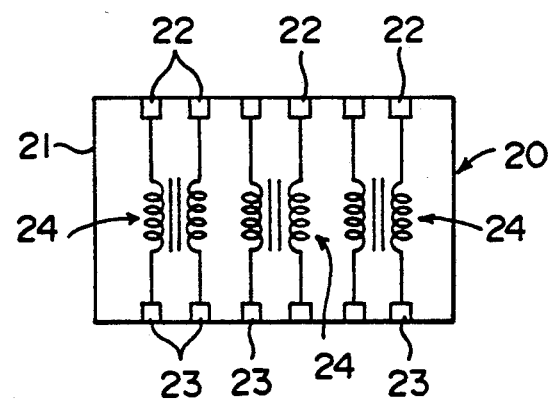
FIG. 3 is a diagram showing an equivalent circuit of the common mode choke coil array.

As shown in FIG. 2, the common mode choke coil array 20 has a base plate 21 which is made of an insulating material such as ceramic, and some common mode choke coils 24 are built into the base plate 21 so as to have an equivalent circuit as shown in FIG. 3. Either end of each choke coil 24 is jointed to electrodes 22 and 23 which are provided for the base plate 21 at either side.

Figure 4:
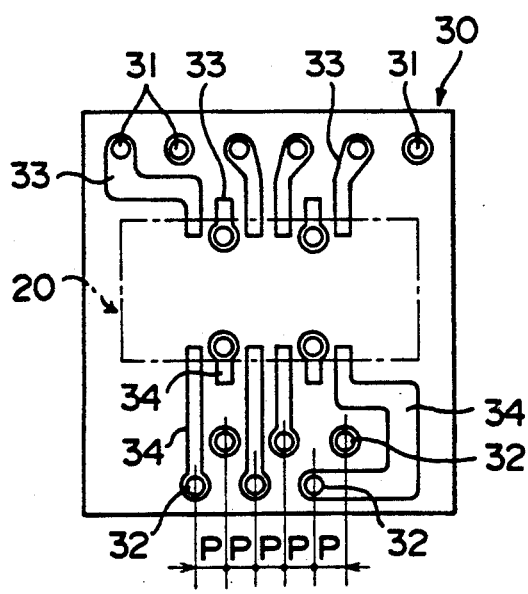
FIG. 4 is a front view of a printed board of the first embodiment.
Figure 5:
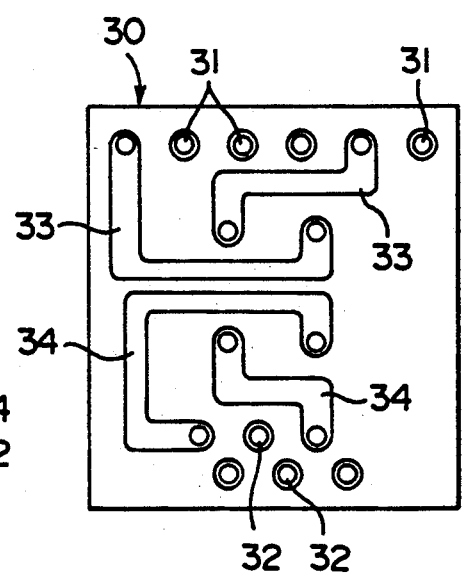
FIG. 5 is a rear view of the printed board.

Referring to FIGS. 4 and 5, the printed board 30 has printed wires 33 and 34 on both sides, and the printed board 30 has through holes 31 and 32. The common mode choke coil array 20 is fixed on the front side of the printed board 30 at the position indicated by the two-dot and a chain line in FIG. 4 by soldering the electrodes 22 and 23 with the wires 33 and 34 respectively. Contactors 35 and terminals 36 are inserted into the respective holes 31 and 32 of the printed board 30, and they are soldered. Thereby, the contactors 35 and the terminals 36 are electrically connected to the common mode choke coils 24.

Figure 11:
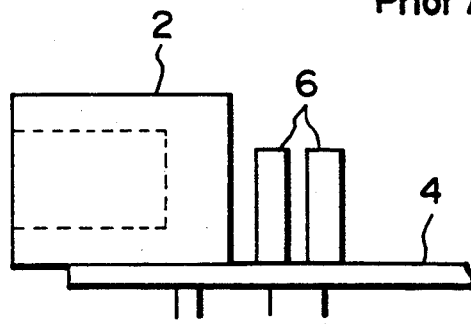
FIG. 11 is a front view of an existing modular jack and a three-terminal capacitor mounted on a circuit board.
Figure 12:
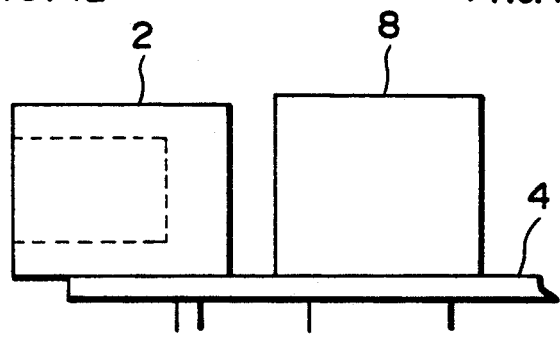
FIG. 12 is a front view of the existing modular jack and a common mode choke coil mounted on the circuit board.
Figure 13:
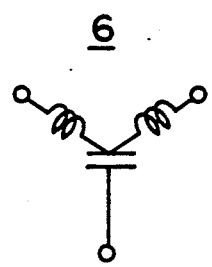
FIG. 13 is a diagram showing an equivalent circuit of the three-terminal capacitor.
Figure 14:
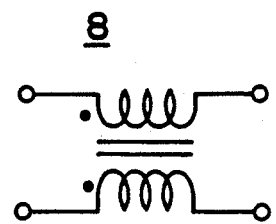
FIG. 14 is a diagram showing an equivalent circuit of the common mode choke coil.

The thus unified common mode choke coil array 20, printed board 30, contactors 35 and terminals 36 are set in the housing 12 so that the choke coil array 20 and the printed board 30 will be set in the chamber 18b, that the terminals 36 will pierce the bottom of the base 14 and that the contactors 35 will extend to the chamber 18a over the separator 19. Then, the lid 16 is put on the base 14, and thus a modular jack is finished. The contactors 35 act as electrical connection terminals with the plugs 60, and the terminals 36 act as fittings in mounting the modular jack on the circuit board 4 (see FIGS. 11 and 12) and also as electrical connection terminals with wires on the circuit board 4.

In the modular jack with this structure, noise is suppressed by the common mode choke coils 24 built into the coil array 20. Specifically, common mode noise received through the contactors 35 is eliminated in the common mode choke coils 24, and thereby outgoing noise through the terminals 36 is suppressed. Because not capacitors but common mode choke coils are used, earth condition hardly affects the noise suppression efficiency. Setting the common mode choke coil array 20 in the housing 12 together with the printed board 30 saves space compared with setting the common mode choke coil 8 outside of the modular jack 2. In order to increase and decrease the number of signal circuits, it is only required to change patterns of the wires 33 and 34 on the printed board 30. Accordingly, an electronic appliance employing this modular jack can be made compact, and the production cost is cheap.

In a known case of setting the three-terminal capacitors 6 or the common mode choke coil 8 outside of the modular jack 2, contactors of the modular jack are put outside of the electronic appliance, which contactors act as antennas, and the modular jack receives external noise. On the other hand, in the modular jack according to this embodiment, the common mode choke coil array 20 is set in the housing 12, which means that the coil array 20 is set close to the contactors 35, and the modular jack hardly receives external noise.

Further, according to this embodiment, the contactors 35 and the terminals 36 can be plated with different metals (for example, the contactors 35 are plated with gold, and the terminals 36 are plated with solder), and there occurs no unnecessary plating. Design of the wires 34 on the printed board 30 is comparatively free, and the pitch P among the holes 32, that is, the pitch among the terminals 36 can be set to 1.02 mm which is the pitch of an ordinary circuit board on which the modular jack is mounted.

Figure 6:
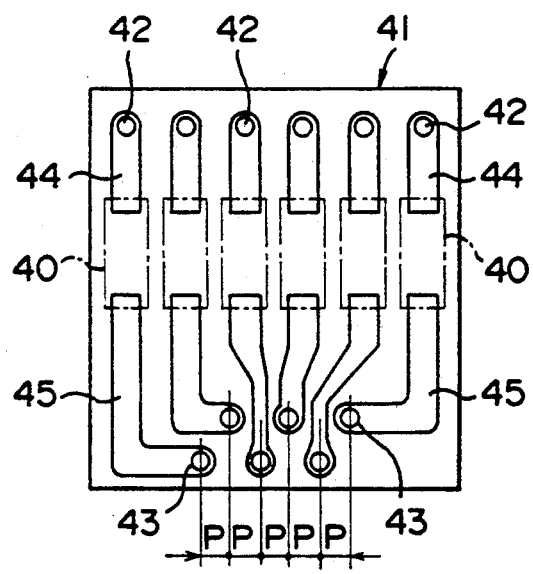
FIG. 6 is a front view of a printed board to be provided for a modular jack which is a second embodiment of the present invention.
Figure 7:
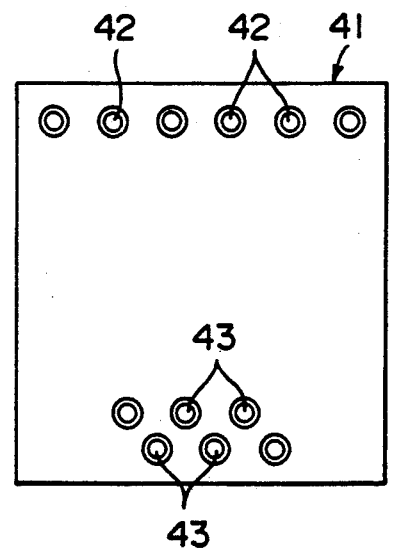
FIG. 7 is a rear view of the printed board of the second embodiment.

Second Embodiment: FIGS. 6 and 7

FIGS. 6 and 7 show a printed board 41 to be employed in a second embodiment. Chip inductors 40 are built into the printed board 41 to be used as a noise suppressor, and printed wires 44 and 45 on the board 41 are connected to the chip inductors 40. At one end of each wire 44 or 45, a through hole 42 or 43 is formed, and the contactors 35 and the terminals 36 (not shown in FIGS. 6 and 7) are inserted into the respective holes 42 and 43 as described in the first embodiment. The printed board 41 is set in the housing 12 in the same manner as described in the first embodiment. The second embodiment brings the same advantages and effects as the first embodiment.

Figure 8:
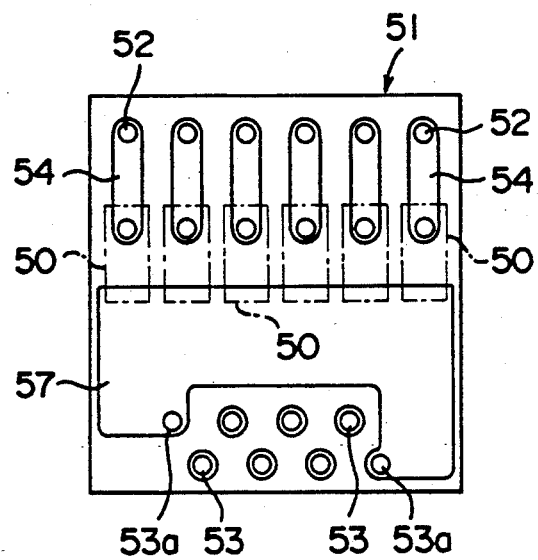
FIG. 8 is a front view of a printed board to be provided for a modular jack which is a third embodiment of the present invention.
Figure 9:
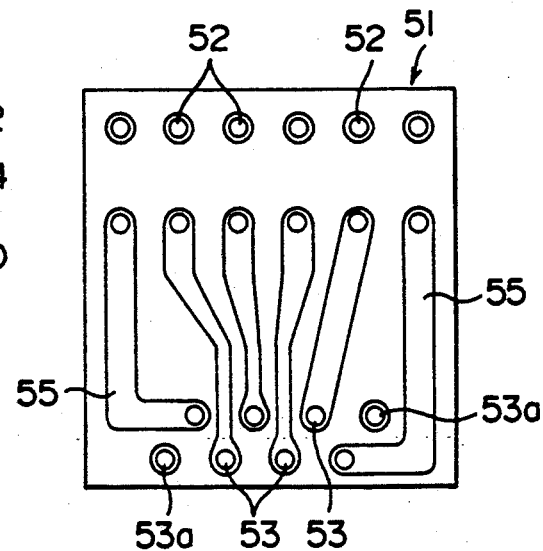
FIG. 9 is a rear view of the printed board of the third embodiment.
Figure 10:
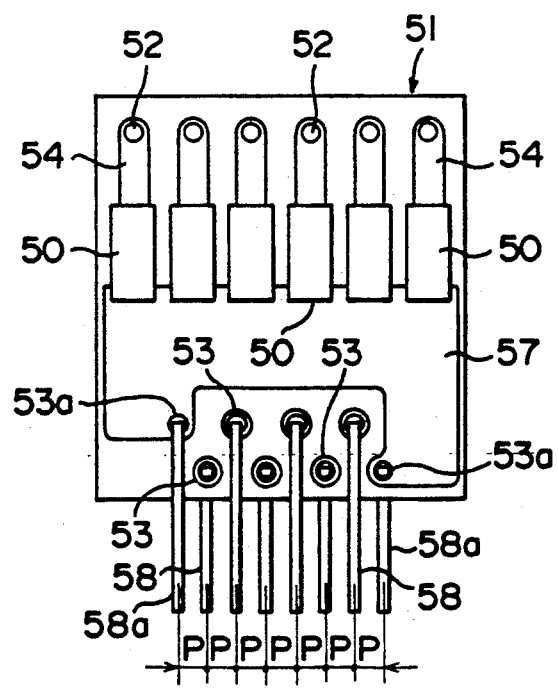
FIG. 10 is a front view of the printed board of the third embodiment in which chip capacitors and terminals are installed.

Third Embodiment: FIGS. 8-10

FIGS. 8 through 10 show a printed board 51 to be employed in a third embodiment. Chip capacitors 50 are built into the printed board 51 to be used as a noise suppressor, and printed wires 54 and 55 and an earth electrode 57 on the board 51 are connected to the capacitors 50. The contactors 35 (not shown in FIGS. 8 through 10) and signal terminals 58 are inserted into holes 52 and 53 respectively. Earth terminals 58a are inserted into holes 53a made in the earth electrode 57 (see FIG. 10).

The printed board 51 is set in the housing 12 in the same manner as described in the first embodiment. The third embodiment brings the same advantages and effects as the first embodiment.

Other embodiments

Although the present invention has been described in conjunction with the embodiments above, it is to be noted that various changes and modifications are apparent to those who are skilled in the art. Such changes and modification are to be understood as included within the scope of the present invention defined by the appended claims.

The number of signal circuits may be set arbitrarily. The method of fixing the printed board 30 in the housing 12, the method of providing an electronic element such as the common mode choke coil array 20, the chip inductors 40, the chip capacitors 50 or the like for the printed board 30, 41 and 51, the method of mounting the modular jack on the circuit board 4, the method of pulling the terminals 36 out of the housing 12, etc. may be determined arbitrarily.

What is claimed is:

1. A modular jack to be mounted on a circuit board, said modular jack comprising:

a printed board containing an electronic element for suppressing noise;

a contactor for contacting with a plug, said contactor being electrically connected with the electronic element by a wire on the printed board;

a terminal for contacting with the circuit board, said terminal being electrically connected with the electronic element by a wire on the printed board; and an insulating housing for encasing the printed board.

2. A modular jack as claimed in claim 1, wherein the noise suppressing electronic element is an array of common mode choke coils.

3. A modular jack as claimed in claim 1, wherein the noise suppressing electronic element is a chip inductor.

4. A modular jack as claimed in claim 1, wherein the noise suppressing electronic element is a chip capacitor.

5. A modular jack as claimed in claim 1, wherein the pitch among a plurality of terminals on the printed board is about 1.02 mm and smaller than the pitch among contactors on the printed board.

6. A modular jack as claimed in claim 1, wherein the interior of the housing is divided into a first chamber in which the printed board is set and a second chamber to which the contactor is extended, and the terminal is protruded outside the housing from the first chamber.

* * * * *